United States Patent
Hotta et al.

(10) Patent No.: US 9,536,782 B2
(45) Date of Patent: Jan. 3, 2017

(54) TUNGSTEN FILM FORMING METHOD, SEMICONDUCTOR DEVICE MANUFACTURING METHOD, AND STORAGE MEDIUM

(71) Applicant: TOKYO ELECTRON LIMITED, Tokyo (JP)

(72) Inventors: Takanobu Hotta, Nirasaki (JP); Yasushi Aiba, Nirasaki (JP); Koji Maekawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/664,945

(22) Filed: Mar. 23, 2015

(65) Prior Publication Data

US 2015/0279735 A1 Oct. 1, 2015

(30) Foreign Application Priority Data

Mar. 25, 2014 (JP) .................................. 2014-061929
Jan. 27, 2015 (JP) .................................. 2015-012922

(51) Int. Cl.
| | | |
|---|---|---|
| *H01L 21/44* | (2006.01) | |
| *H01L 21/768* | (2006.01) | |
| *C23C 16/08* | (2006.01) | |
| *C23C 16/455* | (2006.01) | |
| *C23C 16/46* | (2006.01) | |

(Continued)

(52) U.S. Cl.
CPC ......... *H01L 21/76879* (2013.01); *C23C 16/08* (2013.01); *C23C 16/14* (2013.01); *C23C 16/455* (2013.01); *C23C 16/45525* (2013.01); *C23C 16/46* (2013.01); *H01L 21/28556* (2013.01);

(Continued)

(58) Field of Classification Search
CPC ............. H01L 21/02697; H01L 21/043; H01L 21/0435; H01L 21/044; H01L 21/048; H01L 21/0485; H01L 21/283; H01L 21/285; H01L 21/28506; H01L 21/28512; H01L 21/2855; H01L 21/28556; H01L 21/02; H01L 21/76877; C23C 16/14; C23C 16/44

See application file for complete search history.

(56) References Cited

U.S. PATENT DOCUMENTS 4,849,260 A * 7/1989 Kusumoto .............. C23C 16/14
257/E21.171
5,175,017 A * 12/1992 Kobayashi .............. C23C 16/14
257/E21.162

(Continued)

FOREIGN PATENT DOCUMENTS

| JP | 04-294530 A | 10/1992 |
|---|---|---|
| JP | 05-226282 A | 9/1993 |

(Continued)

*Primary Examiner* — Selim Ahmed
*Assistant Examiner* — Evan Clinton
(74) *Attorney, Agent, or Firm* — Nath, Goldberg & Meyer; Jerald L. Meyer

(57) ABSTRACT

A tungsten film forming method includes: supplying a tungsten chloride gas as a source material of tungsten and a reducing gas towards a substrate to be processed under a depressurized atmosphere to cause reaction between the tungsten chloride gas and the reducing gas while heating the substrate to be processed, such that a main tungsten film is directly formed on a surface of the substrate to be processed without forming an initial tungsten film for nucleus generation.

7 Claims, 7 Drawing Sheets

(51) Int. Cl.
*H01L 21/3205* (2006.01)
*C23C 16/14* (2006.01)
*H01L 21/285* (2006.01)

(52) U.S. Cl.
CPC ... *H01L 21/28562* (2013.01); *H01L 21/32051* (2013.01); *H01L 21/76877* (2013.01)

(56) References Cited

U.S. PATENT DOCUMENTS

2014/0030889 A1* 1/2014 Chen .................. C23C 16/0245
                                                                438/675
2014/0120723 A1* 5/2014 Fu ..................... H01L 21/28506
                                                                438/680

FOREIGN PATENT DOCUMENTS

| JP | 2001525889 A | 12/2001 |
| JP | 2003193233 A | 7/2003 |
| JP | 2004273764 A | 9/2004 |

* cited by examiner

FIG. 2

| | Pressure increase and wafer temperature stabilization | CVD Film formation | Purge |
|---|---|---|---|
| $WCl_6$ (Carrier $N_2$) | | →  | |
| $H_2$ | | →  | |
| Purge $N_2$ (Pipe 64) | ――――――――――――→ | | |
| Purge $N_2$ (Pipe 74) | ――――――――――――→ | | |

H₂ gas alone

H₂ gas + NH₃ gas

TUNGSTEN FILM FORMING METHOD, SEMICONDUCTOR DEVICE MANUFACTURING METHOD, AND STORAGE MEDIUM

CROSS-REFERENCE TO RELATED APPLICATIONS

This application claims the benefit of Japanese Patent Application Nos. 2014-061929 and 2015-012922, filed on Mar. 25, 2014 and Jan. 27, 2015, respectively, in the Japan Patent Office, the disclosure of which is incorporated herein in their entirety by reference.

TECHNICAL FIELD

The present disclosure relates to a tungsten film forming method, a semiconductor device manufacturing method, and a storage medium.

BACKGROUND

In a process of manufacturing a semiconductor device, tungsten is used as material for filling contact holes and via holes between wirings, material for forming wirings and diffusion barriers, and the like, which are all formed in a semiconductor wafer (hereinafter, simply referred to as a "wafer") as a target object.

Physical vapor deposition (PVD) has been used in tungsten film deposition in the art. However, tungsten (W) is a metal having a high melting point, and it is difficult to achieve high step coverage corresponding to a recent trend of miniaturization of devices using PVD. For this reason, a tungsten film is formed using chemical vapor deposition (CVD), which does not require melting of tungsten having a high melting point and is capable of achieving sufficient miniaturization of devices.

In a tungsten film forming method using CVD (CVD-tungsten film), for example, tungsten hexafluoride ($WF_6$) as a source gas and $H_2$ gas as a reducing gas are generally used to cause reaction of $WF_6+3H_2 \rightarrow W+6HF$ on a wafer. Also, in recent years, atomic layer deposition (ALD), in which $WF_6$ gas and the reducing gas are alternately supplied, has attracted attention as a technology for providing higher step coverage.

In the tungsten film formation through CVD or ALD using $WF_6$ as a source gas, it is difficult to form a good tungsten film on a base film such as a TiN film. Accordingly, a two-step film formation process is performed wherein an initial tungsten film (new creation film) for nucleus generation is first formed and a main tungsten film is formed on the new creation film.

However, the new creation film is formed for nucleus generation and has a higher resistance than the main tungsten film in a bulk state. Recently, as semiconductor devices are further miniaturized, the ratio of the new creation film in the tungsten film buried in a depression is also increased. Therefore, it is likely that the new creation film having a high resistance deteriorates the overall resistance of the tungsten film. Moreover, formation of the new creation film in addition to the main tungsten film requires a complicated process.

SUMMARY

Some embodiments of the present disclosure provide a tungsten film forming method, which can form a tungsten film in a single step without forming an initial tungsten film for nucleus generation, a semiconductor device manufacturing method, and a non-transitory computer-readable storage medium.

According to an embodiment of the present disclosure, there is provided a tungsten film forming method including: supplying a tungsten chloride gas as a source material of tungsten and a reducing gas towards a substrate to be processed under a depressurized atmosphere to cause reaction between the tungsten chloride gas and the reducing gas while heating the substrate to be processed, such that a main tungsten film is directly formed on a surface of the substrate to be processed without forming an initial tungsten film for nucleus generation.

According to another embodiment of the present disclosure, there is provided a semiconductor device manufacturing method including: forming a base film on a surface of a substrate to be processed, the substrate to be processed having a depression on the surface thereof; and filling the depression by supplying a tungsten chloride gas as a source material of tungsten and a reducing gas towards the substrate to be processed, which has the base film on the surface thereof, under a depressurized atmosphere to cause reaction between the tungsten chloride gas and the reducing gas while heating the substrate to be processed, such that a main tungsten film is directly formed on a surface of the base film without forming an initial tungsten film for nucleus generation and fills the depression.

According to still another embodiment of the present disclosure, there is provided a non-transitory computer-readable storage medium operating on a computer and storing a program that controls a film forming apparatus, wherein, when executed, the program allows the computer to control the film forming apparatus such that the tungsten film forming method of some embodiments is performed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 illustrates a process recipe for a film formation process by CVD.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The present inventors found that, by using tungsten chloride as a source material of tungsten, a tungsten film can be formed on a surface of a target object through a single-step process without formation of an initial tungsten film for nucleus generation, and completed the present disclosure.

<Film Forming Apparatus>

Figure 1:
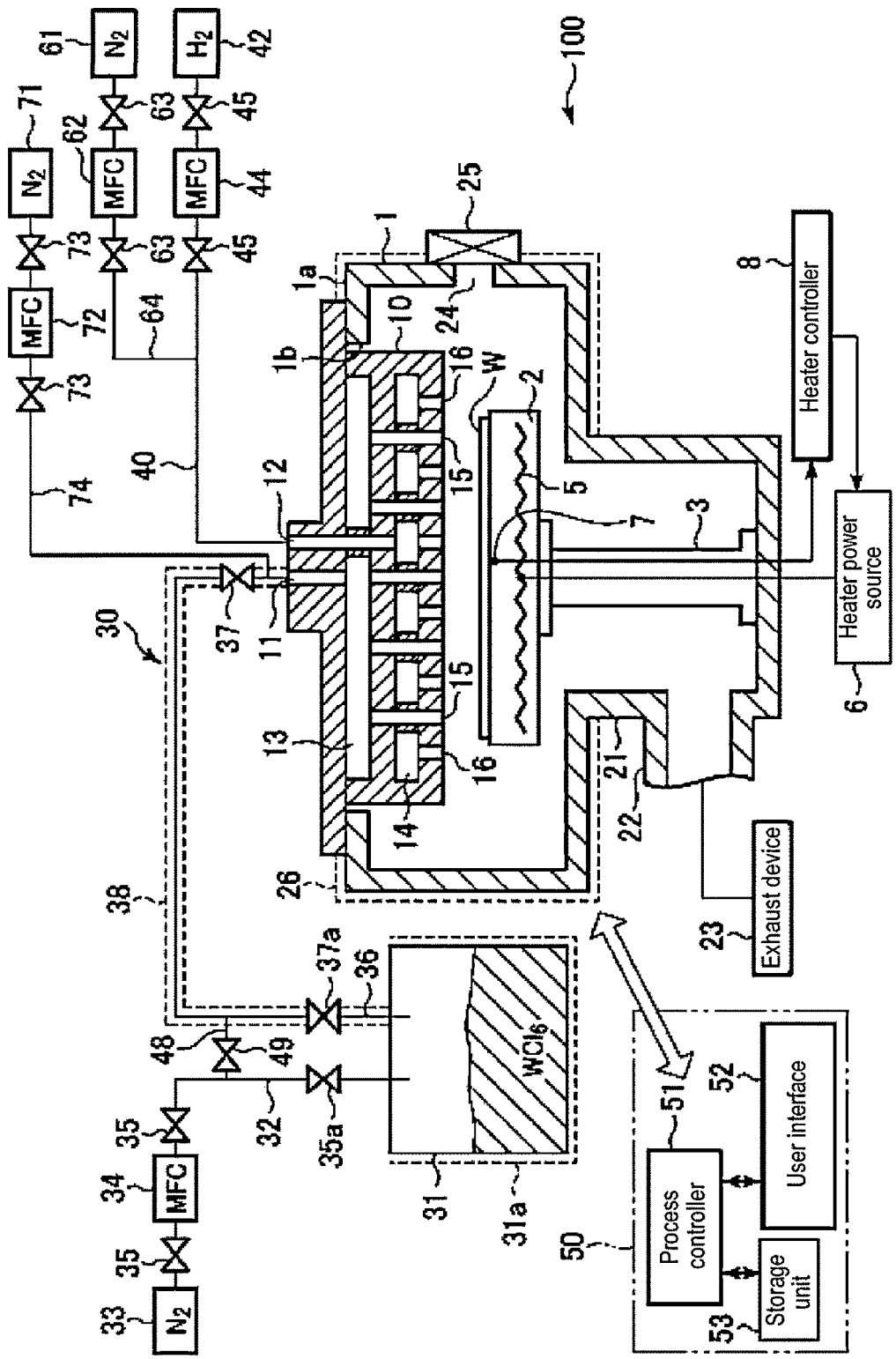
FIG. 1 is a sectional view of one example of a film forming apparatus applicable to a tungsten film forming method according to one embodiment of the present disclosure.

FIG. 1 is a sectional view of one example of a film forming apparatus applicable to a tungsten film forming method according to one embodiment of the present disclosure.

Referring to FIG. 1, a film forming apparatus 100 includes a substantially cylindrical chamber 1 configured to maintain air-tightness, in which a susceptor 2 configured to support a substrate to be processed, that is, a wafer W, in a horizontal state is supported by a cylindrical support member 3 extending from a bottom of an exhaust chamber described below to a lower side center of the susceptor 2. The susceptor 2 is made of a ceramic material, for example, MN and the like. In addition, the susceptor 2 includes a heater 5, which is embedded therein and is connected to a heater power source 6. On the other hand, a thermocouple 7 is disposed near an upper surface of the susceptor 2 and is configured to allow signals of the thermocouple 7 to be sent to a heater controller 8. Further, the heater controller 8 sends a command to the heater power source 6 in response to a signal from the thermocouple 7 to control heating of the heater 5 such that the wafer W has a desired temperature. Further, the susceptor 2 is provided with three wafer lifting pins (not shown), which can protrude or be retracted with respect to the surface of the susceptor 2, such that the wafer lifting pins protrude from the surface of the susceptor 2 during delivery of the wafer W. Further, the susceptor 2 can be lifted by a lift mechanism (not shown).

A ceiling wall 1a of the chamber 1 is formed with a circular opening 1b, through which a showerhead 10 is inserted to protrude into the chamber 1. The showerhead 10 is configured to inject $WCl_6$ gas, which is a source gas for film formation supplied from a gas supply mechanism 30 described below, into the chamber 1, and is provided at an upper portion thereof with a first introduction channel 11 through which $WCl_6$ gas and $N_2$ gas as a purge gas are introduced into the chamber 1, and with a second introduction channel 12 through which $H_2$ gas as a reducing gas and $N_2$ gas as a purge gas are introduced into the chamber 1.

The showerhead 10 has upper and lower spaces 13 and 14 therein. The first introduction channel 11 is connected to the upper space 13 and a first gas injection channel 15 extends from the upper space 13 to a lower surface of the showerhead 10. A second introduction channel 12 is connected to the lower space 14 and a second gas injection channel 16 extends from the lower space 14 to the lower surface of the showerhead 10. That is to say, the showerhead 10 is configured to allow $WCl_6$ gas as a source gas for film formation and $H_2$ gas as a reducing gas to be independently injected through the first and second injection channels 15 and 16, respectively.

The chamber 1 is provided at a bottom wall thereof with an exhaust chamber 21 protruding downwards. The exhaust chamber 21 is connected at a side surface thereof to an exhaust pipe 22, to which an exhaust device 23 including a vacuum pump, a pressure control valve and the like are connected. The interior of the chamber 1 can be maintained in a predetermined depressurized state by operation of the exhaust device 23.

A sidewall of the chamber 1 is provided with a transfer gate 24 through which the wafer W is transferred, and a gate valve 25 for opening and closing the transfer gate 24. Furthermore, a heater 26 is provided to a wall portion of the chamber 1 to control the temperature of an inner wall of the chamber 1 during film formation.

The gas supply mechanism 30 includes a film formation source tank 31 which accommodates a source for film formation such as $WCl_6$ as tungsten chloride. $WCl_6$ has a solid phase at room temperature, and $WCl_6$ as tungsten chloride in a solid state is accommodated in the source tank 31. A heater 31a is installed around the source tank 31 and is configured to heat $WCl_6$ to a suitable temperature so as to sublimate $WCl_6$ accommodated in the source tank 31. Alternatively, $WCl_5$ or $WCl_4$ may be used as tungsten chloride. $WCl_5$ or $WCl_4$ exhibit substantially the same behavior as that of $WCl_6$.

A carrier gas pipe 32 is inserted into the source tank 31 from above and supplies $N_2$ gas as a carrier gas to the source tank 31. The carrier gas pipe 32 is connected to a $N_2$ gas source 33. Further, the carrier gas pipe 32 is provided with a mass flow controller 34 acting as a flow rate controller and valves 35 disposed at both sides of the mass flow controller 34. Further, a source gas supply pipe 36 is inserted at one end thereof into the source tank 31 from above and is connected at the other end thereof to the first introduction channel 11 of the showerhead 10. The source gas supply pipe 36 is provided with a valve 37. The source gas supply pipe 36 is provided with a heater 38 to prevent condensation of $WCl_6$ gas, which is a source gas for film formation. In addition, the $WCl_6$ gas sublimated in the source tank 31 is transferred by $N_2$ gas (carrier $N_2$) acting as a carrier gas to be supplied into the showerhead 10 through the source gas supply pipe 36 and the first introduction channel 11. Further, the source gas supply pipe 36 is connected to a $N_2$ gas source 71, which supplies $N_2$ gas (purge $N_2$) acting as a purge gas through a pipe 74. The pipe 74 is provided with a mass flow controller 72 acting as a flow rate controller and valves 73 disposed at both sides of the mass flow controller 72. $N_2$ gas supplied from the N2 gas source 71 is used as a purge gas at a source gas line side.

Furthermore, a bypass pipe 48 is disposed between the carrier gas pipe 32 and the source gas supply pipe 36 and is provided with a valve 49. Valves 35a and 37a are placed at a downstream side and an upstream side of connection portions of the bypass pipe 48 to the carrier gas pipe 32 and the source gas supply pipe 36, respectively. Thus, by closing the valves 35a and 37a while opening the valve 49, N$_2$ gas can be purged from the N2 gas source 33 to the source gas supply pipe 36 through the carrier gas pipe 32 and the bypass pipe 48. Here, other inert gases including Ar gas may be used as the carrier gas and the purge gas without being limited to N$_2$ gas.

The second introduction channel 12 of the showerhead 10 is connected to a pipe 40 acting as a H$_2$ gas line, and the pipe 40 is connected to a H$_2$ gas source 42, which supplies H$_2$ gas acting as a reducing gas, and to a N$_2$ gas source 61, which supplies N$_2$ gas (purge N$_2$) acting as a purge gas through a pipe 64. Further, the pipe 40 is provided with a mass flow controller 44, acting as a flow rate controller, and valves 45 disposed at both sides of the mass flow controller 44, and the pipe 64 is provided with a mass flow controller 62, acting as a flow rate controller, and valves 63 disposed at both sides of the mass flow controller 62. N$_2$ gas supplied from the N$_2$ gas source 61 is used as a purge gas at a H$_2$ gas line side.

As the reducing gas, SiH$_4$ gas, B$_2$H$_6$ gas, or NH$_3$ gas may also be used without being limited to H$_2$ gas. In some embodiments, at least two among H$_2$ gas, SiH$_4$ gas, B$_2$H$_6$ gas and NH$_3$ gas may be supplied. In alternative embodiments, other reducing gases, for example, PH$_3$ gas and SiH$_2$Cl$_2$ gas, may be used.

The film forming apparatus 100 includes a controller 50 configured to control various components, specifically, valves, a power source, heaters, pumps, and the like. The controller 50 includes a process controller 51 including a microprocessor (computer), a user interface 52, and a storage unit 53. The process controller 51 is electrically connected to the various components of the film forming apparatus 100 and is configured to control the same. The user interface 52 is connected to the process controller 51 and is composed of a keyboard, by which an operator performs command input operation and the like to manage the respective components of the film forming apparatus 100, a display configured to visualize and display operating states of the respective components of the film forming apparatus 100, and the like. The storage unit 53 is also connected to the process controller 51, and stores control programs configured to realize various processes executed in the film forming apparatus 100 by control of the process controller 51, control programs configured to execute a certain process in each component of the film forming apparatus 100, that is, recipes, various databases, and the like. The recipes are stored in non-transitory storage media (not shown) of the storage unit 53. The storage media may include fixedly installed storage media such as hard disks, or portable storage media such as CDROMs, DVDs, flash memory, and the like. Alternatively, the recipes may be appropriately transferred from another apparatus, for example, through a dedicated line.

In addition, the recipes are read from the storage unit 53 according to an instruction from the user interface 52, as needed, and a process based on the read recipes is then performed by the process controller 51, thereby allowing a desired process to be performed by the film forming apparatus 100 under a control of the controller 51.

<Embodiment of Film Forming Method>

Next, one embodiment of a film forming method using the film forming apparatus 100 as described above will be described.

In this embodiment, a wafer having a base film formed on a surface thereof is used as a substrate to be processed. For example, the wafer may include a barrier metal film as the base film formed on a surface of a thermal oxide film, or on a surface of an interlayer insulating film having depressions such as trenches or holes. In some embodiments, the base film may be a TiN film or a TiSiN film. Use of the TiN or TiSiN film as the base film can improve film formability of a tungsten film.

In film formation, first, with the gate valve 25 opened, a wafer W is transferred into the chamber 1 through the transfer gate 24 by a transfer device (not shown) and is loaded on the susceptor 2, which is heated to a certain temperature by the heater 5, and in turn the chamber 1 is evacuated to a certain degree of vacuum. Thereafter, a tungsten film forming process is performed through CVD or ALD described hereinafter.

(Film Formation Process by CVD)

First, a film formation process by CVD will be described.

FIG. 2 illustrates a process recipe for a film formation process by CVD. With the valves 37, 37a and 45 of the film forming apparatus 100 of FIG. 1 closed, the valves 63 and 73 are opened to supply N$_2$ gas (purge N$_2$) as a purge gas from the N$_2$ gas sources 61 and 71 to the chamber 1 through the pipes 64 and 74 so that the inner pressure of the chamber 1 is increased while the temperature of the wafer W placed on the susceptor 2 is stabilized.

After the inner pressure of the chamber 1 reaches a certain pressure, while purge N$_2$ is supplied from the N$_2$ gas sources 61 and 71, the valves 37 and 37a are opened to supply a carrier gas, that is, N$_2$ gas (carrier N$_2$), into the source tank 31 and to supply WCl$_6$ gas, which is generated by sublimation of WCl$_6$ within the source tank 31, into the chamber 1. In addition, the valve 45 is opened to supply H$_2$ gas from the H$_2$ gas source 42 into the chamber 1. As a result, through reaction between WCl$_6$ gas as a source gas of tungsten and H$_2$ gas as a reducing gas, a tungsten film is formed on the base film formed on the surface of the wafer W. When WCl$_5$ gas or WCl$_4$ gas is used as the source gas of tungsten, the tungsten film is formed through the same process.

After the tungsten film is formed to be a desired thickness, the valve 45 is closed to stop supply of H$_2$ gas, and the valves 37 and 37a are also closed to stop supply of WCl$_6$ gas while supplying N$_2$ gas as a purge gas into the chamber 1 to purge the inside of the chamber 1. In this way, the film formation process by CVD is completed. Here, the thickness of the tungsten film may be adjusted through control of the film formation time.

(Film Formation Process by ALD)

Next, a film formation process by ALD will be described.

Figure 3:
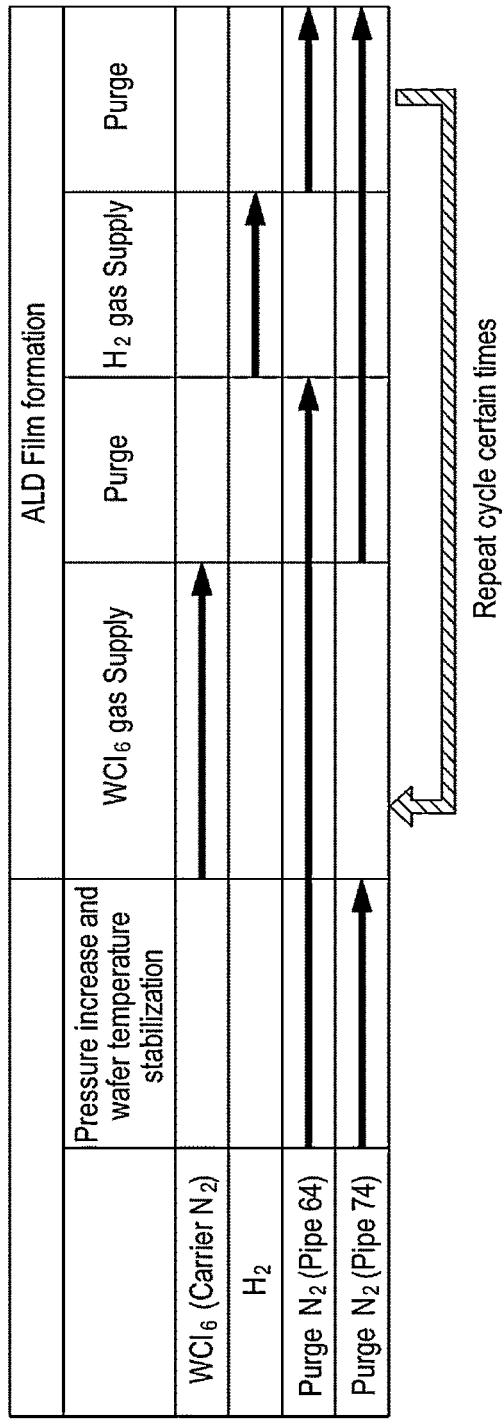
FIG. 3 illustrates a process recipe for a film formation process by ALD.

FIG. 3 illustrates a process recipe for a film formation process by ALD. Similar to CVD, with the valves 37, 37a and 45 of the film forming apparatus 100 closed, the valves 63 and 73 are opened to supply N$_2$ gas (purge N$_2$) as a purge gas from the N$_2$ gas sources 61 and 71 to the chamber 1 through the pipes 64 and 74 so that the inner pressure of the chamber 1 is increased while the temperature of the wafer placed on the susceptor 2 is stabilized.

After the inner pressure of the chamber 1 reaches a certain pressure, while purge N$_2$ is supplied from the N$_2$ gas source 61 through the pipe 64, the valve 73 is closed to stop supply of purge N$_2$ through the pipe 74, and the valves 37 and 37a are opened to supply the carrier N$_2$ from the N$_2$ gas source 33 into the source tank 31 and to supply WCl$_6$ gas sublimated within the source tank 31 into the chamber 1 for a short period of time such that WCl$_6$ can be adsorbed onto the base film formed on the surface of the wafer W (WCl$_6$ gas supply step). Then, the valves 37 and 37a are closed to stop supply of WCl$_6$ gas and the valve 73 is opened to supply purge N$_2$ from the pipe 74 as well as purge N$_2$ from the pipe 64 into the chamber 1 to purge the remaining WCl$_6$ gas in the chamber 1 (first purge step).

Then, while purge $N_2$ gas is supplied from the $N_2$ gas source 71 through the pipe 74, the valve 63 is closed to stop supply of purge $N_2$ through the pipe 64 and the valve 45 is opened to supply $H_2$ gas from the $H_2$ gas source 42 into the chamber 1 for a short period of time so as to react the $H_2$ gas with $WCl_6$ adsorbed onto the wafer W ($H_2$ gas supply step). Then, the valve 45 is closed to stop supply of $H_2$ gas and the valve 63 is opened to supply, in addition to purge $N_2$ from the pipe 74, purge $N_2$ from the pipe 64 into the chamber 1 to purge the remaining $H_2$ gas in the chamber 1 (second purge step).

A thin unit tungsten film is formed by one cycle of the $WCl_6$ gas supply step, the first purge step, the $H_2$ gas supply step, and the second purge step as described above. Then, a tungsten film having a desired thickness may be formed by repeating the cycle of these steps plural times. The thickness of the tungsten film may be adjusted by adjusting the number of repetitions of the cycle. In some embodiments, $WCl_5$ gas or $WCl_4$ gas may be used instead of $WCl_6$ as the source gas of tungsten. Furthermore, instead of $H_2$ gas, at least one among $SiH_4$ gas, $B_2H_6$ gas and $NH_3$ gas may be used as some or all of the reducing gas. Also, other reducing gases, for example, $PH_3$ gas and $SiH_2Cl_2$ gas, may be used.

(Film Formation Conditions)

When tungsten chloride such as $WCl_6$ and the like is used as a source material of tungsten, since a tungsten chloride gas also has an etching function, the base film or the tungsten film formed thereon can be subjected to etching reaction by the tungsten chloride gas according to temperature and pressure conditions, thereby making it difficult to form the tungsten film. Accordingly, it is desirable to set the temperature and pressure conditions so as to prevent etching reaction. More specifically, since film formation reaction or etching reaction does not occur at a low temperature, it is necessary to set a temperature to be high enough to cause the film formation reaction. Further, since a low pressure can cause an etching reaction even at a temperature that allows for film formation reaction, it is desirable to perform the film formation under a high pressure condition.

Specifically, although the temperature and pressure conditions depend on the types of the base film or gases, the film formation can be performed at a wafer temperature (susceptor surface temperature) of 250 degrees C. or higher and an inner pressure, within a chamber, of 5 Torr (667 Pa) or higher in both CVD and ALD. When $H_2$ gas is used alone as the reducing gas, the wafer temperature (susceptor surface temperature) may be set to 400 degrees C. or higher. However, use of $NH_3$ gas together with $H_2$ gas as the reducing gas provides good reactivity and enables reduction of the wafer temperature to about 250 degrees C. When the wafer temperature is lowered below 250 degrees C., it is difficult to secure a film formation reaction even with the $NH_3$ gas. Furthermore, when the inner pressure of the chamber is lower than 5 Torr, etching reaction is likely to occur at a temperature of 250 degrees C. or higher. Thus, although there is no limit on an upper limit of the wafer temperature, an actual upper limit of the wafer temperature may be set to about 800 degrees C. in terms of equipment constraints and reactivity. The wafer temperature may be 700 degrees C. or less in some embodiments, 650 degrees C. or less in other embodiments, and 550 degrees C. or less in still other embodiments. Furthermore, when $H_2$ gas is used alone as the reducing gas, the wafer temperature may be set in the range of 400 degrees C. to 550 degrees C., and when the $H_2$ gas is used together with $NH_3$ gas, the wafer temperature may be set in the range of 250 degrees C. to 550 degrees C.

Use of $NH_3$ gas together with $H_2$ gas as the reducing gas provides good reactivity and thus can increase a film formation rate while decreasing the film formation temperature. On the other hand, when $NH_3$ gas is used together with $H_2$ gas as the reducing gas, the tungsten film is likely to have a larger amount of impurities than in the case where $H_2$ gas is used alone. Thus, in order to secure good film quality through reduction in impurity amount in the tungsten film, it is desirable that $H_2$ gas be used alone as the reducing gas. From the viewpoint of realizing low temperature film formation and high film formation rate within an allowable range of impurities, $NH_3$ gas may be added at a ratio of 10% to 80% in some embodiments to $H_2$ gas as the reducing gas in terms of flow rate percent.

Further, although there is no limit on an upper limit of pressure based on the same reason described above, an actual upper limit of the inner pressure is set to about 100 Torr (13333 Pa) in terms of equipment constraints and reactivity. In some embodiments, the inner pressure may have an upper limit of 10 to 30 Torr (1333 to 4000 Pa).

When $WCl_6$ gas is used as a tungsten chloride gas, $H_2$ gas is used as a reducing gas, and $N_2$ gas is used as a carrier gas and a purge gas, the following are other film formation conditions.

CVD
Carrier $N_2$ gas flow rate: 20 to 500 sccm (mL/min)
($WCl_6$ gas flow rate: 0.25 to 15 sccm (mL/min))
$H_2$ gas flow rate: 500 to 5000 sccm (mL/min)
Temperature of film formation source tank: 130 to 170 degrees C.

ALD
Carrier $N_2$ gas flow rate: 20 to 500 sccm (mL/min)
($WCl_6$ gas flow rate: 0.25 to 15 sccm (mL/min))
$WCl_6$ gas supply time (for each supply step): 0.5 to 10 sec
$H_2$ gas flow rate: 500 to 5000 sccm (mL/min)
$H_2$ gas supply time (for each supply step): 0.5 to 10 sec
Temperature of film formation source tank: 130 to 170 degrees C.

Effects of Embodiments

In a conventional film formation process in which $WF_6$ is used as a source gas to form a tungsten film, it is difficult to form a tungsten film with high step coverage on a base film due to poor adhesion to a thermal oxide film or an interlayer insulating film and long incubation time. For this reason, it was necessary in the conventional film formation process that a two-step film formation process is performed in order to secure film formation with high step coverage. The two-step film forming process includes: forming an initial tungsten film (new creation film) for nucleus generation on a base film under conditions specified for nucleus generation using $SiH_4$ or $B_2H_6$ as a reducing gas; and forming a main tungsten film using $H_2$ gas as a reducing gas.

However, since the new creation film is formed for a purpose of nucleus generation and has a higher resistance than the main tungsten film in a bulk state, according to miniaturization of semiconductor devices, the tungsten film increases in resistance with an increase in a ratio of the new creation film, which is buried in depressions, in the tungsten film.

On the contrary, in the embodiment of the present disclosure, the film formation is performed with CVD or ALD as described above using tungsten chloride such as $WCl_6$ as a source material of tungsten, whereby a tungsten film with high step coverage can be formed through a single-step film formation process without forming a new creation film. As a result, it is possible to avoid inconvenience due to formation of the new creation film while suppressing an increase in resistance due to miniaturization. For example, when $H_2$ gas is used as a reducing gas, it is possible to realize a low resistance of about 25 to 35 $\mu\Omega$·cm at a film thickness of about 20 nm while maintaining a low resistance of fine wirings.

Application Example

Next, an application example of the film forming method according to this embodiment of the present disclosure will be described with reference to FIGS. 4A to 4C.

Figure 4A:
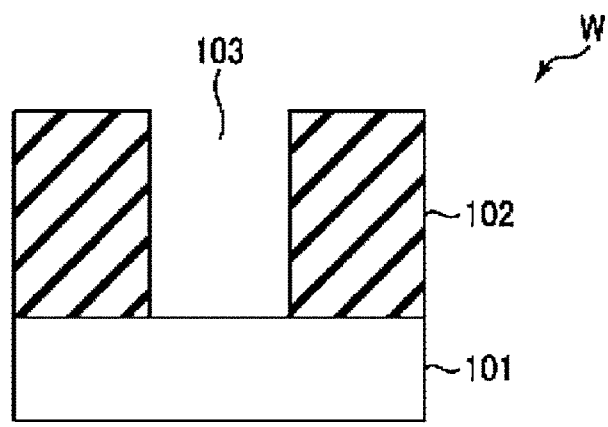
FIGS. 4A to 4C illustrate sectional process views of an application example of the film forming method according to the present disclosure, wherein the film forming method is applied to formation of wirings or plugs by burying a tungsten film in a depression.

First, a wafer W is prepared (FIG. 4A). Here, the wafer W includes: a base structure 101 having a diffusion region on a lower transistor or silicon substrate (a detailed description will be omitted); an interlayer insulating film 102 such as a $SiO_2$ film, a low-k film (SiCO, SiCOH, and the like) and the like formed on the base structure 101; and a depression 103 such as a trench or hole formed in the interlayer insulating film 102.

Figure 4B:
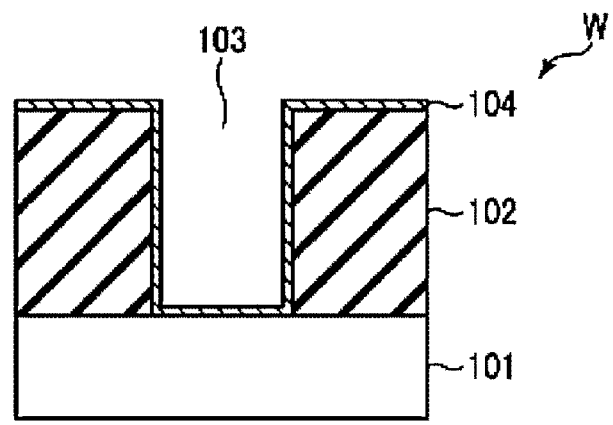
Figure 4C:
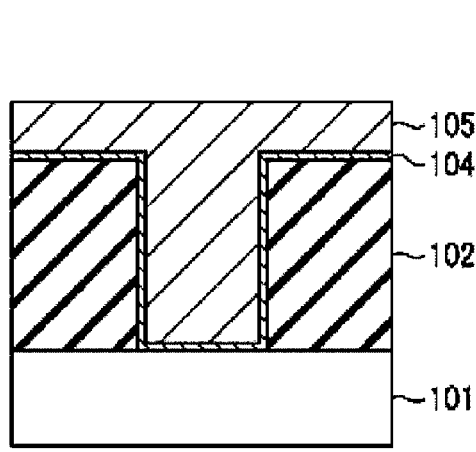

Then, a metal barrier film 104 as a base film is formed over the entire surface of the interlayer insulating film 102 including the depression 103 (FIG. 4B). The metal barrier film 104 may be a TiN film in some embodiments. The TiN film may be suitably formed by CVD or ALD. The metal bather film 104 may have a thickness of about 2 to 5 nm in some embodiments.

Then, with respect to the wafer W on which the metal barrier film 104 as the base film is formed, a tungsten film 105 is directly formed on a surface of the metal barrier film 104 without forming a new creation film (FIG. 4C) so that the depression 103 is filled with the tungsten film 105. As described above, the tungsten film 105 is formed by CVD or ALD using $WCl_6$ as a source gas and $H_2$ gas as a reducing gas under a depressurized condition.

As a result, a low-resistance tungsten film with high step coverage can be formed through single-step film formation, thereby forming a wiring or a plug in the depression 103.

Figure 5:
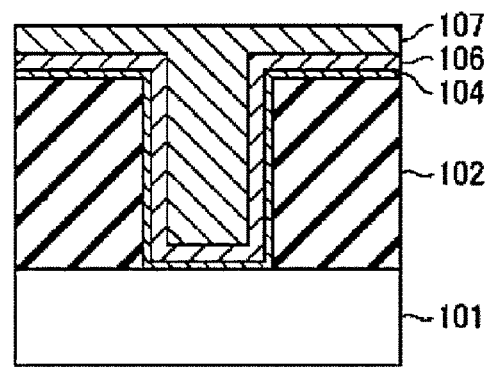
FIG. 5 is a sectional view illustrating a state where a tungsten film is buried in a depression by a conventional two-step film formation process.

In formation of a conventional tungsten film, a new creation film 106 having a high resistance is formed on the metal barrier film 104 and then a main tungsten film 107 having a low resistance is formed on the new creation film 106, as illustrated in FIG. 5. Therefore, in a case where the wiring width (the width of the depression 103) is decreased to, for example, 20 nm, the ratio of the new creation film 106 is increased to be relatively high and the resistance of a tungsten wiring (plug) is also increased. On the contrary, in the embodiment of the present disclosure, since the tungsten film 105 having a low resistance is buried in the entirety of the depression 103 as shown in FIG. 4C, it is possible to obtain a tungsten wiring (plug) of low resistance even if the wiring width is decreased to about 20 nm

EXPERIMENTAL EXAMPLE

Next, experimental examples of the present disclosure will be described.

Experimental Example 1

First, a relationship between a thickness of a tungsten film and a resistivity thereof was obtained. In this example, tungsten films having various thicknesses were formed on a TiN film formed on a surface of a silicon wafer by ALD using the film forming apparatus 100 of FIG. 1, and a resistivity of each tungsten film was measured. Film formation was performed under conditions of: a carrier $N_2$ gas flow rate of 500 sccm (a $WCl_6$ gas flow rate of 10 sccm), a $H_2$ gas flow rate of 4500 sccm, a $WCl_6$ gas supply time for each supply step of 1.5 seconds, a $H_2$ gas supply time for each supply step of 3 seconds, a purge time for each purge step of 5 seconds, the number of cycles of 200 to 1000 times, and the following three temperature•pressure conditions A to C.

Figure 6:
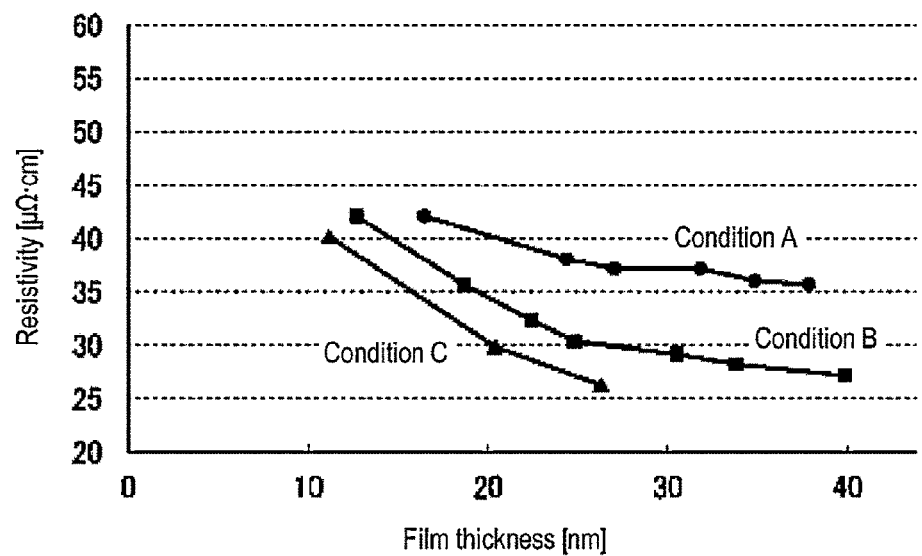
FIG. 6 is a graph depicting a relationship between a film thickness and a resistivity of a tungsten film while varying a film formation temperature and a film formation pressure in Experimental Example 1.

[Condition A] Temperature: 500 degrees C., Pressure: 30 Torr
[Condition B] Temperature: 500 degrees C., Pressure: 20 Torr
[Condition C] Temperature: 430 degrees C., Pressure: 30 Torr Results of the experiment are illustrated in FIG. 6. As illustrated in FIG. 6, 20 nm thick films having a low resistivity of 40 $\mu\Omega$·cm or less were obtained under any conditions, and further a resistivity of 30 $\mu\Omega$·cm or less could be selectively obtained depending on the film formation conditions. That is to say, it was confirmed that a low resistance can be obtained even in fine wirings.

Experimental Example 2

In this example, a TiN film as a base film was formed in a hole having a top diameter of 180 nm and an aspect ratio of 60, and then a tungsten film was directly formed on the TiN film to fill the hole through ALD. In this example, film formation was performed using the film forming apparatus 100 of FIG. 1 under the following conditions: a wafer temperature of 500 degrees C., an inner pressure of chamber of 30 Torr, a carrier N2 gas flow rate of 500 sccm (a $WCl_6$ gas flow rate of 10 sccm), a $H_2$ gas flow rate of 4500 sccm, a $WCl_6$ gas supply time for each supply step of 1.5 seconds, a $H_2$ gas supply time for each supply step of 3 seconds, a purge time for each purge step of 5 seconds, and the number of cycles of 500 times.

Figure 7:
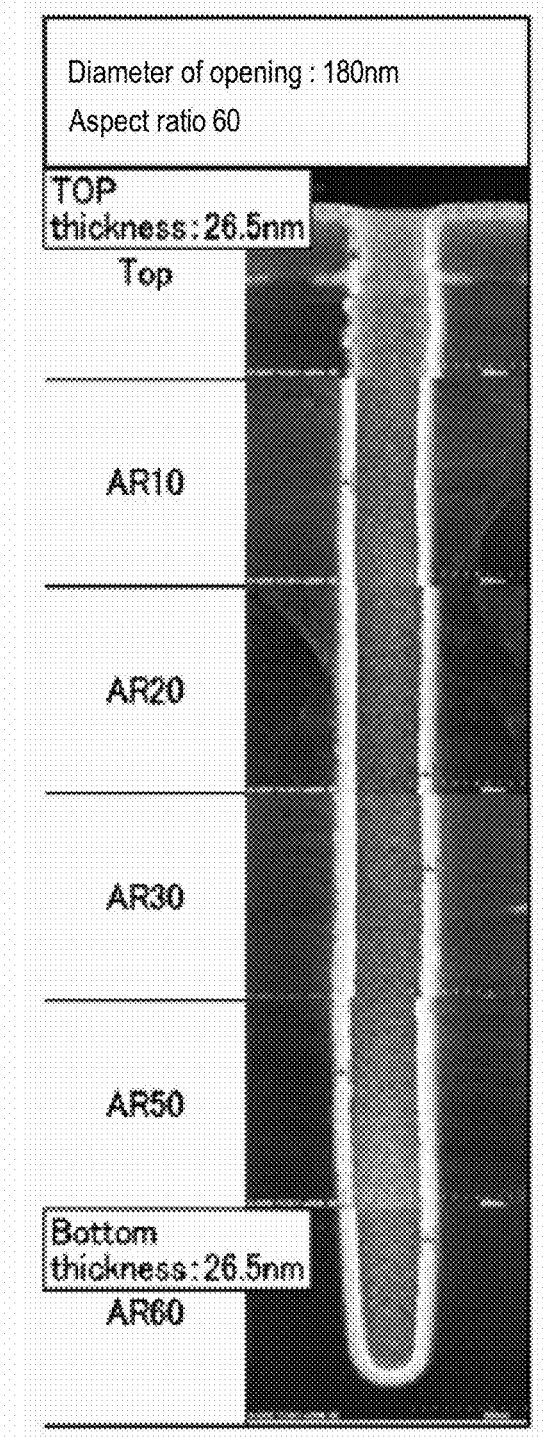
FIG. 7 is a sectional scanning electronic micrograph (SEM) image illustrating a state where a tungsten film is directly formed on a TiN film, which is formed in a hole having an aspect ratio of 60, such that the hole is filled with the tungsten film in Experimental Example 2.

FIG. 7 is a sectional SEM image illustrating a result of Experimental Example 2. As illustrated in FIG. 7, it was confirmed that the tungsten film with good step coverage was formed to reach the bottom of the hole, which has a top diameter of 180 nm and an aspect ratio of 60, through single-step film formation without using a new creation film.

Experimental Example 3

In this example, film formability was evaluated in a case of using $H_2$ gas alone as a reducing gas and in a case of adding $NH_3$ gas to $H_2$ gas as the reducing gas. Tungsten films were formed at various temperatures on a TiN film formed on a surface of a silicon wafer by ALD using the film forming apparatus 100 of FIG. 1. Here, formation of the tungsten films was performed under the following conditions: a carrier $N_2$ gas flow rate of 500 sccm (a $WCl_6$ gas flow rate of 10 sccm), a $WCl_6$ gas supply time at each supply step of 1.5 seconds, a $H_2$ gas supply time for each supply step of 3 seconds, a purge time for each purge step of 5 seconds, the number of cycles of 50 to 300 times, and a wafer temperature (susceptor surface temperature) of 250 to 500 degrees C. Further, in the case of using $H_2$ gas alone as a reducing gas, $H_2$ gas was supplied at 2000 sccm, and in the case of adding $NH_3$ gas to $H_2$ gas as the reducing gas, $H_2$ gas was supplied at 2000 sccm and $NH_3$ gas was supplied at 25 to 1500 sccm.

Figure 8:
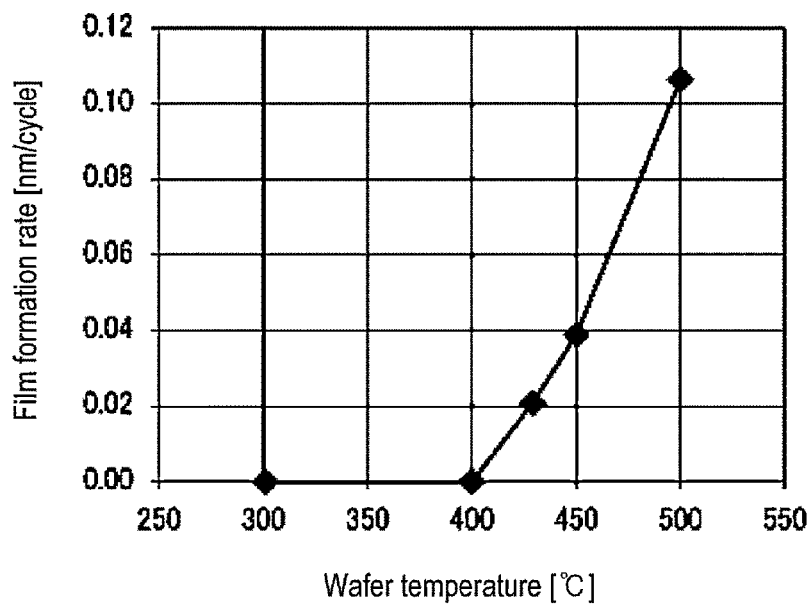
FIG. 8 is a graph depicting a relationship between a film formation temperature and a film formation rate when using $H_2$ gas alone as a reducing gas in Experimental Example 3.
Figure 9:
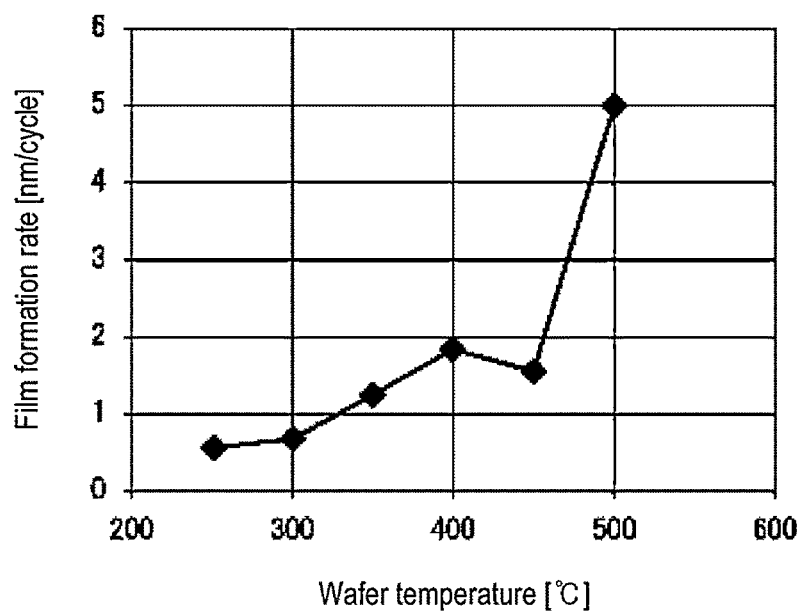
FIG. 9 is a graph depicting a relationship between a film formation temperature and a film rate when using $H_2$ and $NH_3$ as a reducing gas in Experimental Example 3.

FIG. 8 illustrates a relationship between a wafer temperature and a film formation rate (per cycle) when $H_2$ gas is used alone as the reducing gas, and FIG. 9 illustrates a relationship between a wafer temperature and a film formation rate (per cycle) when $NH_3$ gas was added to $H_2$ gas as the reducing gas. As illustrated in FIGS. 8 and 9, it was confirmed that the tungsten film is not formed at 400 degrees C. or less when $H_2$ gas was used alone as the reducing gas, whereas the tungsten film can be formed at 250 degrees C. or higher when $NH_3$ was added as the reducing gas. Further, the film formation rate was 0.11 nm/cycle even at the highest temperature of 500 degrees C. when $H_2$ gas was used alone as the reducing gas, whereas the film formation rate exceeded 0.5 nm/cycle even at 250 degrees C., about 2 nm/cycle at 400 degrees C., and 5 nm/cycle at 500 degrees C., when $NH_3$ gas was added as the reducing gas. Thus, it was confirmed that the film formation temperature was decreased together with a significant increase in the film formation rate when $NH_3$ gas was added as the reducing gas. Also, it was confirmed that the tungsten film has a lower resistivity when using $H_2$ gas alone as the reducing gas and that use of $H_2$ gas alone as the reducing gas is more advantageous in terms of good film quality.

Other Applications

It should be understood that the present disclosure is not limited to the aforementioned embodiments and may be modified in various ways. For example, in the aforementioned embodiment, the present disclosure has been described by way of an example wherein a semiconductor wafer was used as a target object. However, the semiconductor wafer may be a silicon semiconductor or compound semiconductors such as GaAs, SiC, GaN, and the like. In addition, the present disclosure is not limited to the semiconductor wafer, and may be applied to glass substrates used in flat panel displays (FPDs) for liquid crystal displays and the like, ceramic substrates, and the like.

According to the present disclosure, a tungsten chloride gas is used as a source gas, whereby a tungsten film can be formed on a surface of a target object in a single step process without forming a nucleus generation film. As a result, it is possible to prevent an increase in resistance due to miniaturization while avoiding process inconvenience.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A tungsten film forming method, comprising:
supplying a tungsten chloride gas as a source material of tungsten and a reducing gas towards a substrate to be processed under a depressurized atmosphere to cause reaction between the tungsten chloride gas and the reducing gas while heating the substrate to be processed, such that a main tungsten film is directly formed on a surface of the substrate to be processed without forming an initial tungsten film for nucleus generation,
wherein the tungsten chloride gas is selected from a group consisting of $WCl_6$ gas, $WCl_5$ gas, and $WCl_4$ gas,
wherein the reducing gas is at least one selected from a group consisting of $H_2$ gas, $SiH_4$ gas, $B_2H_6$ gas, and $NH_3$ gas, and
wherein a temperature of the substrate to be processed is 250 degrees C. or higher and an inner pressure of a reaction chamber is 10 to 30 Torr.

2. The tungsten film forming method of claim 1, wherein the substrate to be processed has a base film as a surface layer and the surface of the substrate where the tungsten film is formed is a surface of the base film.

3. The tungsten film forming method of claim 2, wherein the base film is a TiN film or a TiSiN film.

4. The tungsten film forming method of claim 1, wherein the substrate to be processed has a depression, and the main tungsten film is formed in the depression such that the depression is filled with the main tungsten film.

5. A semiconductor device manufacturing method, comprising:
forming a base film on a surface of a substrate to be processed, the substrate to be processed having a depression on the surface thereof; and
filling the depression by supplying a tungsten chloride gas as a source material of tungsten and a reducing gas towards the substrate to be processed, which has the base film on the surface thereof, under a depressurized atmosphere to cause reaction between the tungsten chloride gas and the reducing gas while heating the substrate to be processed, such that a main tungsten film is directly formed on a surface of the base film without forming an initial tungsten film for nucleus generation and fills the depression,
wherein the tungsten chloride gas is selected from a group consisting of $WCl_6$ gas, $WCl_5$ gas, and $WCl_4$ gas,
wherein the reducing gas is at least one selected from a group consisting of $H_2$ gas, $SiH_4$ gas, $B_2H_6$ gas, and $NH_3$ gas, and
wherein filling the depression is performed under conditions that a temperature of the substrate is 250 degrees C. or higher and an inner pressure of a reaction chamber is 10 to 30 Torr.

6. The semiconductor device manufacturing method of claim 5, wherein the base film is a TiN film or a TiSiN film.

7. A non-transitory computer-readable storage medium operating on a computer and storing a program that controls a film forming apparatus, wherein, when executed, the program allows the computer to control the film forming apparatus such that the tungsten film forming method of claim 1 is performed.

* * * * *

UNITED STATES PATENT AND TRADEMARK OFFICE
CERTIFICATE OF CORRECTION

PATENT NO. : 9,536,782 B2
APPLICATION NO. : 14/664945
DATED : January 3, 2017
INVENTOR(S) : Takanobu Hotta, Yasushi Aiba and Koji Maekawa Page 1 of 1

It is certified that error appears in the above-identified patent and that said Letters Patent is hereby corrected as shown below:

In the Specification

Column 1, Line 50; please remove the phrase "new creation film" and replace with "nucleation film".
Column 1, Line 52; please remove the phrase "new creation film" and replace with "nucleation film".
Column 1, Line 53; please remove the phrase "new creation film" and replace with "nucleation film".
Column 1, Line 56; please remove the phrase "new creation film" and replace with "nucleation film".
Column 1, Line 58; please remove the phrase "new creation film" and replace with "nucleation film".
Column 1, Line 60; please remove the phrase "new creation film" and replace with "nucleation film".
Column 8, Line 51; please remove the phrase "new creation film" and replace with "nucleation film".
Column 8, Line 55; please remove the phrase "new creation film" and replace with "nucleation film".
Column 8, Lines 59-60; please remove the phrase "new creation film" and replace with "nucleation film".
Column 8, Line 67; please remove the phrase "new creation film" and replace with "nucleation film".
Column 9, Line 2; please remove the phrase "new creation film" and replace with "nucleation film".
Column 9, Line 32; please remove the phrase "new creation film" and replace with "nucleation film".
Column 9, Lines 40-41; please remove the phrase "new creation film" and replace with "nucleation film".
Column 9, Line 43; please remove the phrase "new creation film" and replace with "nucleation film".
Column 9, Line 46; please remove the phrase "new creation film" and replace with "nucleation film".
Column 10, Line 43; please remove the phrase "new creation film" and replace with "nucleation film".

Signed and Sealed this
Third Day of June, 2025

Coke Morgan Stewart
*Acting Director of the United States Patent and Trademark Office*